United States Patent
Hiroyama et al.

(10) Patent No.: US 6,891,872 B1
(45) Date of Patent: May 10, 2005

(54) SEMICONDUCTOR LASER DEVICE AND METHOD OF MANUFACTURING THE SAME

(75) Inventors: Ryouji Hiroyama, Kyotanabe (JP);
Yasuhiko Nomura, Moriguchi (JP);
Koutarou Furusawa, Higashiosaka (JP); Kunio Takeuchi, Joyo (JP);
Shigeyuki Okamoto, Kobe (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 240 days.

(21) Appl. No.: 09/669,448

(22) Filed: Sep. 25, 2000

(30) Foreign Application Priority Data

Sep. 27, 1999 (JP) .......................................... 11-272436
Jan. 21, 2000 (JP) ...................................... 2000-012681

(51) Int. Cl.[7] .............................................. H01S 5/00
(52) U.S. Cl. ............................. 372/46; 372/45; 372/43; 372/44
(58) Field of Search ............................. 372/45, 46, 43, 372/44

(56) References Cited

U.S. PATENT DOCUMENTS

| | | | |
|---|---|---|---|
| 5,065,402 A | * 11/1991 | Kawano ....................... | 372/46 |
| 5,065,404 A | * 11/1991 | Okajima et al. .............. | 372/45 |
| 5,383,215 A | 1/1995 | Narui et al. ................... | 372/46 |
| 5,608,752 A | * 3/1997 | Goto et al. .................... | 372/46 |
| 5,786,234 A | 7/1998 | Nagai et al. | |
| 5,838,028 A | 11/1998 | Horie et al. | |
| 5,960,019 A | * 9/1999 | Hayashi et al. ............... | 372/45 |
| 6,118,800 A | * 9/2000 | Kidoguchi et al. ........... | 372/46 |
| 6,127,201 A | * 10/2000 | Chino et al. .................. | 372/44 |
| 6,175,582 B1 | 1/2001 | Naito et al. ................... | 372/45 |
| 6,404,790 B1 | * 6/2002 | Narui et al. .................. | 372/43 |

FOREIGN PATENT DOCUMENTS

| | | |
|---|---|---|
| CN | 1169047 A | 12/1997 |
| CN | 1218319 A | 6/1999 |
| EP | 0 660 472 | 12/1994 |
| EP | 0 782 230 A1 | 7/1997 |
| EP | 0 785 602 A1 | 7/1997 |
| JP | 62-54987 | 3/1987 |
| JP | 08-307010 | 11/1996 |
| JP | 09-116222 | 5/1997 |

OTHER PUBLICATIONS

First Office Action with the English Translation issue by The Patent Office of The State Intellectual Property Office Of The People's Republic Of China dated Aug. 8, 2003.
Chinese Office Action dated Feb. 20, 2004.

* cited by examiner

Primary Examiner—Jerome Jackson
Assistant Examiner—Matthew C Landau
(74) Attorney, Agent, or Firm—Armstrong, Kratz, Quintos, Hanson & Brooks, LLP

(57) ABSTRACT

A semiconductor laser device is characterized in that an angle θ of inclination formed by the side surfaces of a ridge portion and a lower part of the ridge portion is at least 70° and not more than 117°, a p-type cladding layer is made of $Al_{X1}Ga_{1-X1}As$, a first current blocking layer is made of $Al_{X2}Ga_{1-X2}As$, the distance between an emission layer and the first current blocking layer satisfies the relation of $t \leq 0.275/(1-(X2-X1))$ assuming that t represents the distance, and a lower width W of the ridge portion is at least 2 μm and not more than 5 μm.

7 Claims, 18 Drawing Sheets

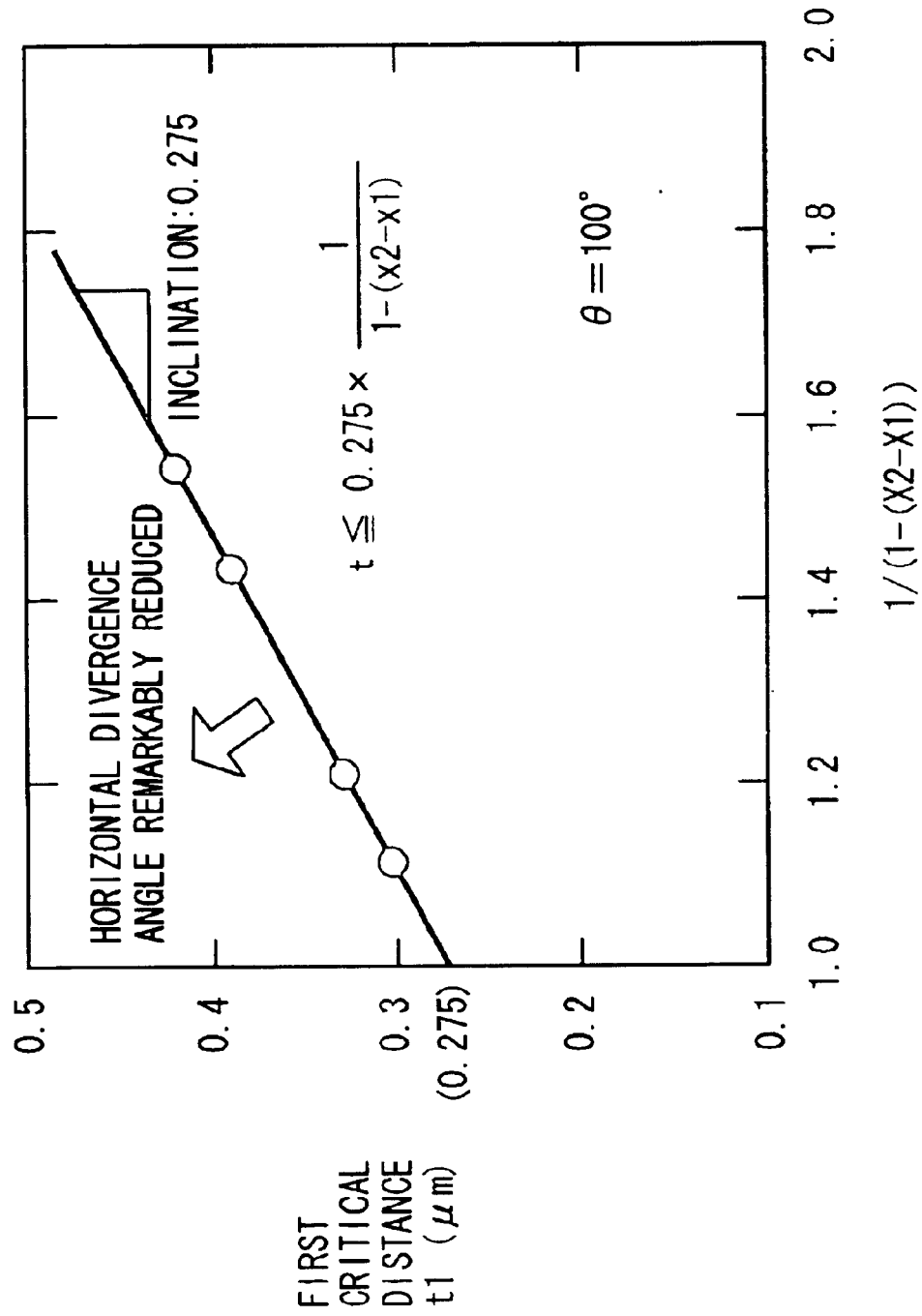

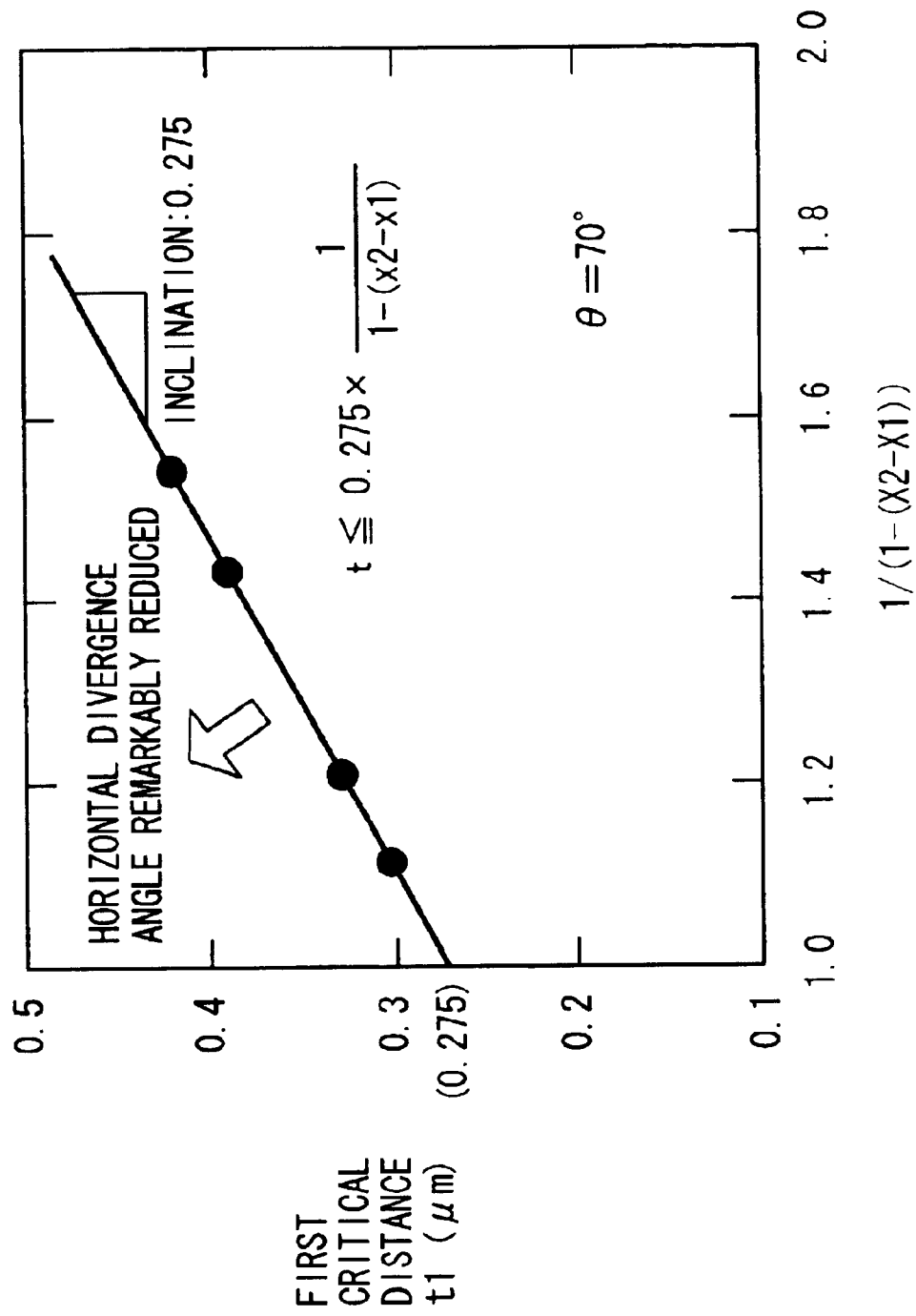

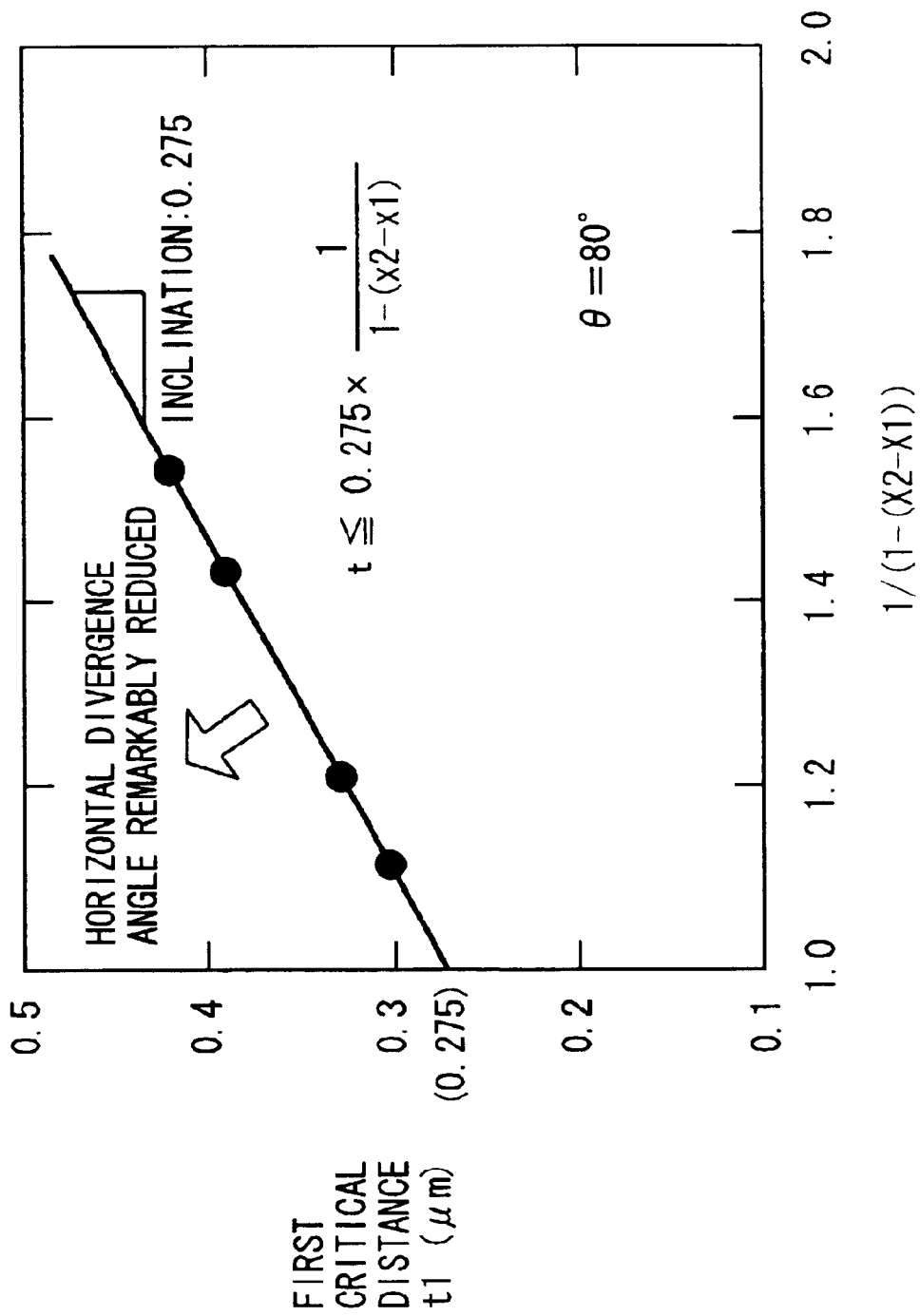

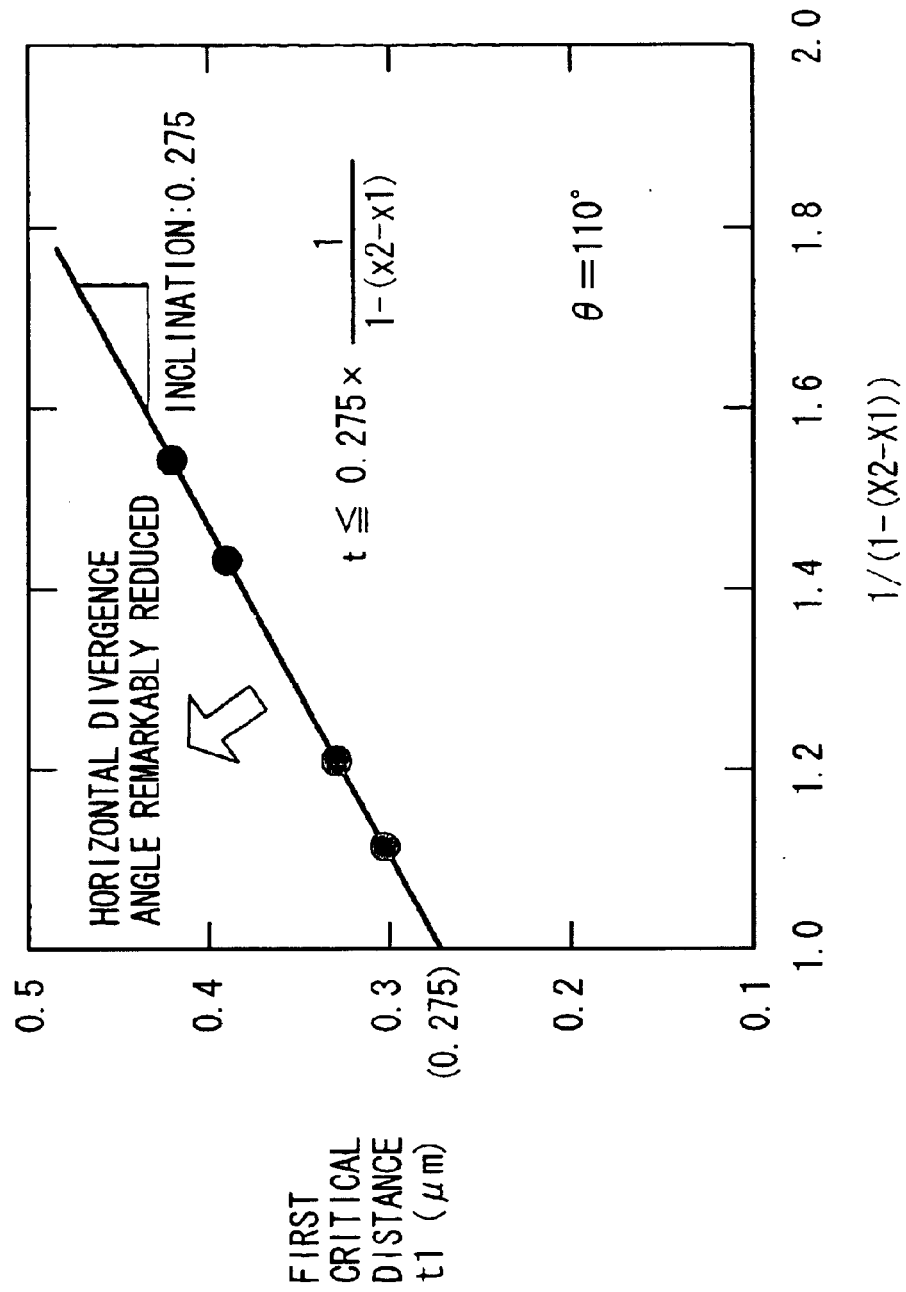

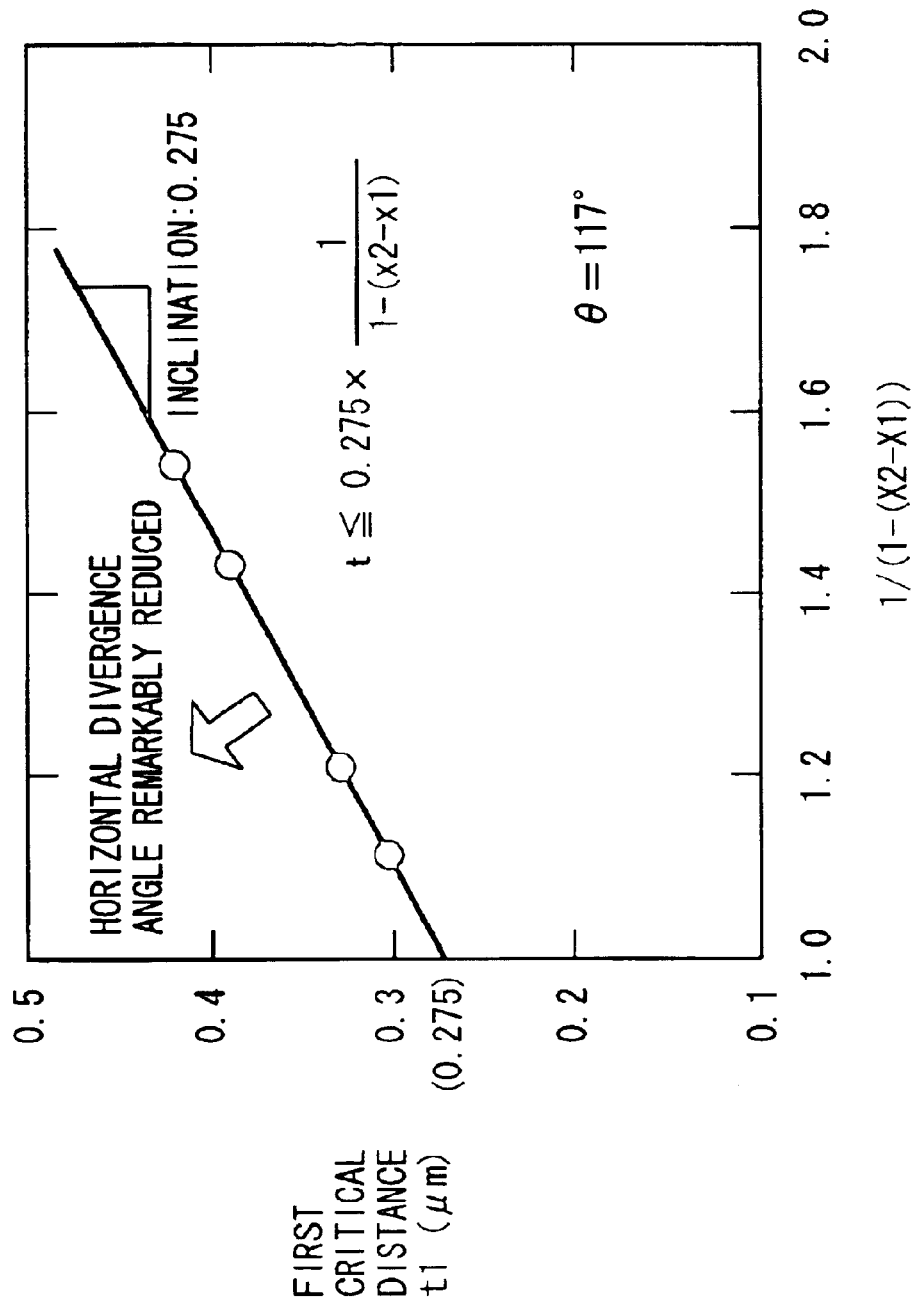

F I G. 1 4
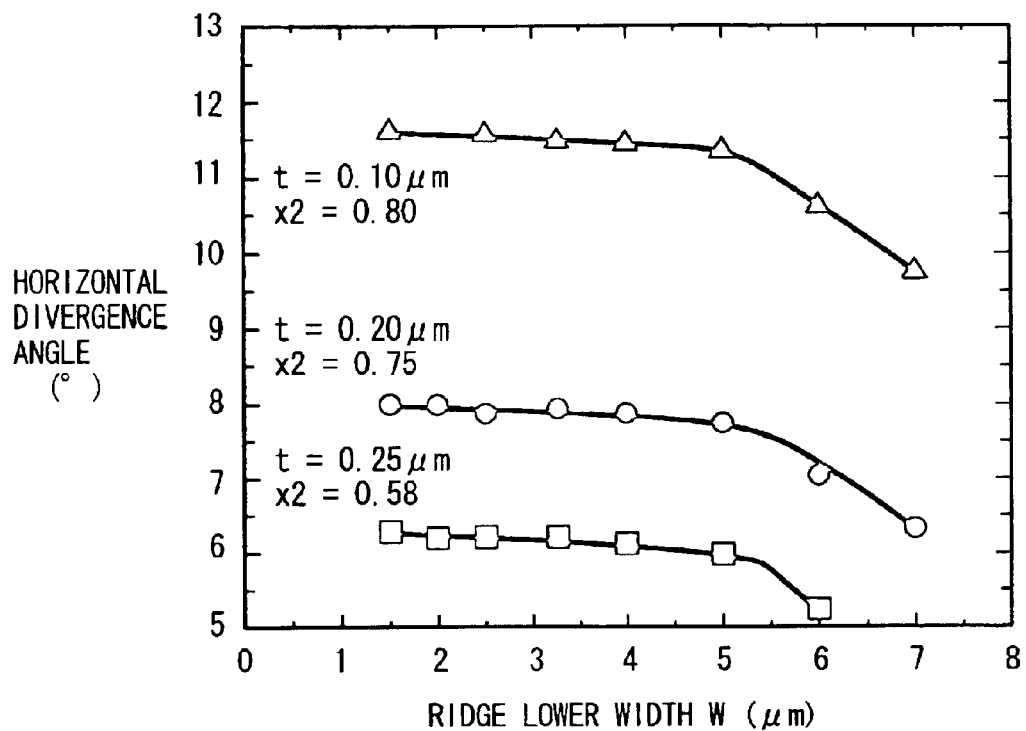
F I G. 1 5
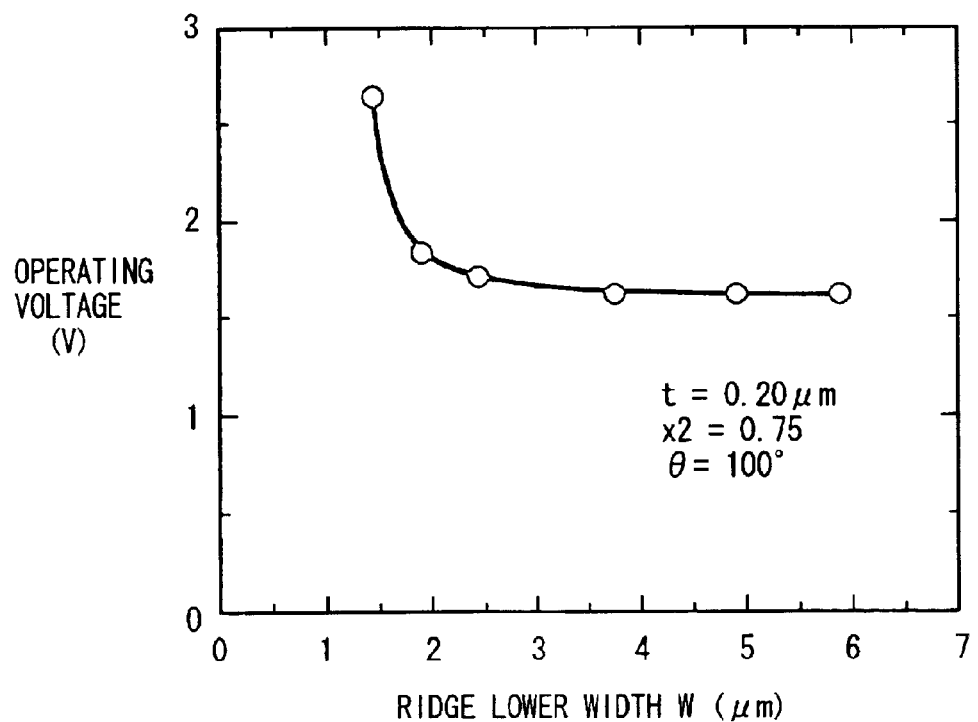

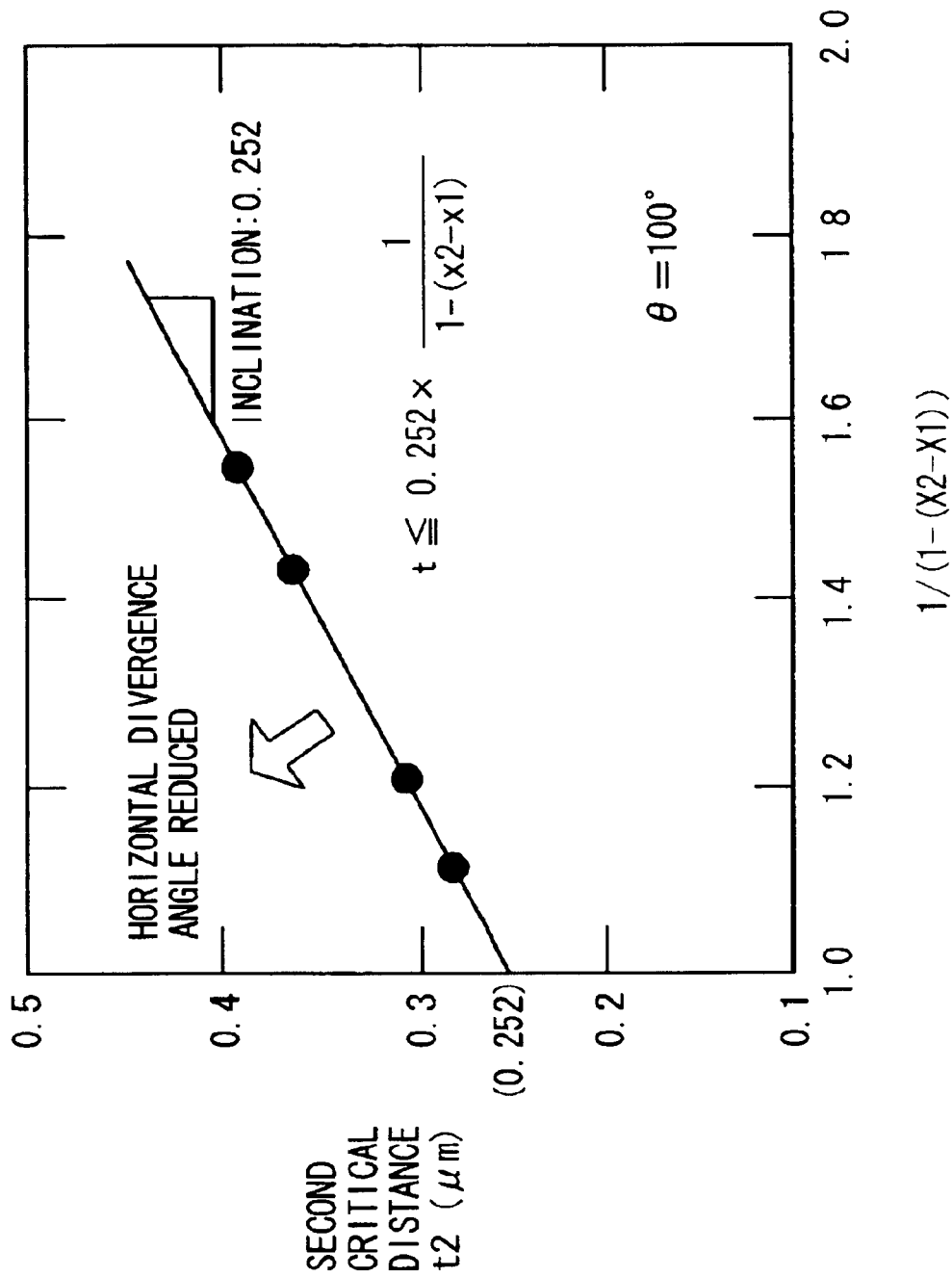

SEMICONDUCTOR LASER DEVICE AND METHOD OF MANUFACTURING THE SAME

BACKGROUND OF THE INVENTION

1. Field of the Invention

The present invention relates to a semiconductor laser device preferably applied to an optical disk system or the like and a method of manufacturing the same.

2. Description of the Prior Art

The Internet and electronic mails have rapidly come into wide use in recent years, leading to increasing enlargement of the personal computer market. Optical disk systems employing disk-shaped optical recording media such as CD-ROMs or DVD-ROMs are indispensable as the storage media for personal computers. In such optical disk systems, transition from a reproduction only type to a writing type and to a rewritable type is getting obvious.

A semiconductor laser device, which is a key device for an optical disk system, is strongly required to have a high output in order to improve the writing speed of the optical disk system.

FIG. 17 shows the basic structure of a typical conventional ridge type semiconductor laser device. In the case of a GaAs-based semiconductor laser device, for example, an n-type buffer layer 702 of n-type GaAs, an n-type cladding layer 703 of n-type AlGaAs, an emission layer of AlGaAs and a p-type cladding layer 705 of p-type AlGaAs are formed on an n-type semiconductor substrate 701 of n-type GaAs.

The p-type cladding layer 705 has a striped ridge portion provided with a central portion having a larger thickness than those of flat side portions for transverse mode control of the semiconductor laser device. An n-type blocking layer 706 of n-type AlGaAs is formed on the side surfaces and flat surfaces of the p-type cladding layer 705, in order to limit a current injection region.

Further, a p-type contact layer 707 of p-type GaAs is formed on the p-type cladding layer 705 and the n-type blocking layer 706. An n-type electrode 708 is formed on the rear surface of the n-type semiconductor substrate 701, while a p-type electrode 709 is formed on the p-type contact layer 707.

The p-type contact layer 707, having a smaller band gap than that of the emission layer 704, absorbs some of light generated in the emission layer 704. A laser beam is strongly confined in the stack direction of the semiconductor layers due to this absorption, to increase light density on the front facet of the laser device.

When the light density is increased on the front facet of the laser device, the aforementioned conventional semiconductor laser device is readily broken on the front facet. In order to increase the output of the semiconductor laser device, therefore, the light density on the front facet may be reduced by increasing the height H as well as the lower width W of the ridge portion.

When the height H of the ridge portion is increased in the semiconductor laser device shown in FIG. 17 provided with the ridge portion of a forward mesa structure having an upwardly reduced width, however, the width of the upper surface of the ridge portion is so reduced that a current hardly flows. Therefore, increase of the height H of the ridge portion is limited.

When the lower width W of the ridge portion is increased, on the other hand, it is difficult to confine light in the parallel direction to the junction plane and a horizontal divergence angle of the laser beam is abruptly reduced. Therefore, the difference between the horizontal and vertical divergence angles of the laser beam is increased to result in a problem such as deterioration of light gathering power or the like. When changing the width W, further, the horizontal divergence angle so remarkably changes that it is difficult to adjust the horizontal divergence angle.

In a semiconductor laser device provided with a ridge portion of a reverse mesa structure having an upwardly increased width, the width of the upper surface of the ridge portion is not reduced also when the height of the ridge portion is increased, and hence the aforementioned problem of the current is not caused in this case. However, a problem caused by increasing the bottom width of the ridge portion still remains.

SUMMARY OF THE INVENTION

The present invention has been proposed in consideration of the aforementioned disadvantages of the prior art, and an object thereof is to provide a semiconductor laser device capable of suppressing reduction of a horizontal divergence angle of a laser beam and readily adjusting the horizontal divergence angle of the laser beam also when increasing the output of the laser beam.

Another object of the present invention is to provide a method of manufacturing a semiconductor laser device, which can readily manufacture a semiconductor laser device capable of suppressing reduction of a horizontal divergence angle of a laser beam and readily adjusting the horizontal divergence angle of the laser beam also when increasing the output of the laser beam.

A semiconductor laser device according to an aspect of the present invention comprises a substrate, a first conductivity type cladding layer, an emission layer, a second conductivity type cladding layer containing Al as a group III element and formed with a ridge portion and a current blocking layer, formed on the second conductivity type cladding layer around the ridge portion, containing Al as a group III element in this order, while an angle θ of inclination on the side surfaces of the ridge portion with respect to the upper surface of the substrate is at least 70° and not more than 117°, the distance t between the emission layer and the current blocking layer satisfies the relation of $t \leq 0.275/(1-(X2-X1))$ [μm] assuming that X1 represents the composition ratio of Al in group III elements forming the second conductivity type cladding layer, X2 represents the composition ratio of Al in group III elements forming the current blocking layer and t represents the distance, and a lower width W of the ridge portion is at least 2 μm and not more than 5 μm.

The semiconductor laser device having such a structure exhibits small change of a horizontal divergence angle of a laser beam also when the lower width W of the ridge portion is increased for attaining a high output. Further, the distance between the emission layer and the current blocking layer is so set as not abruptly reduce the horizontal divergence angle of the laser beam. In addition, the lower width W of the ridge portion is set in a range not abruptly increasing an operating voltage.

When the current blocking layer is formed by a plurality layers, the current blocking layer nearest to the ridge portion has the Al composition X2. The lower width W of the ridge portion stands for the length of the lowermost part of the ridge portion in a direction perpendicular to a cavity.

In particular, the first conductivity type cladding layer preferably contains Al and Ga as group III elements and X1 preferably represents the composition ratio of Al in the sum of the contents of Al and Ga, while the current blocking layer preferably contains Al and Ga as group III elements and X2 preferably represents the composition ratio of Al in the sum of the contents of Al and Ga. In this case, the aforementioned effects are remarkable.

The second conductivity type cladding layer is preferably made of $Al_{X1}Ga_{1-X1}As$, and the current blocking layer is preferably made of $Al_{X2}Ga_{1-X2}As$. Thus, the aforementioned effects are further obvious.

The distance t may satisfy the relation of $t \leq 0.252/(1-(X2-X1))$ [$\mu$m]. In this case, the horizontal divergence angle of the laser beam is less reduced but attains a value exceeding a constant level.

In particular, the distance t is preferably at least 0.15 $\mu$m. In this case, the horizontal divergence angle exhibits a small fluctuation width regardless of fluctuation of the distance t.

The distance t is more preferably at least 0.2 $\mu$m. In this case, the horizontal divergence angle exhibits a smaller fluctuation width when the distance t fluctuates.

The upper surface of the substrate is preferably the {100} plane or inclined by several degrees from the {100} plane, and the ridge portion preferably extends in the <011> direction. Alternatively, the upper surface of the substrate is preferably the {100} plane or inclined by several degrees from the {100} plane, and the ridge portion preferably extends in the <011> direction.

In the semiconductor laser device having such a plane orientation, the ridge portion having the angle θ of inclination of at least 70° and not more than 117° on the side surfaces with respect to the upper surface of the substrate can be readily formed.

A method of manufacturing a semiconductor laser device according to another aspect of the present invention comprises steps of forming a first conductivity type cladding layer, an emission layer, a second conductivity type first cladding layer having a prescribed thickness, an etching stop layer and a second conductivity type second cladding layer having a composition ratio X1 of Al in group III elements on a substrate in this order, partially removing the second cladding layer thereby forming a ridge portion having an angle θ of inclination of at least 70° and not more than 117° on the side surfaces with respect to the upper surface of the substrate and a lower width W of at least 2 $\mu$m and not more than 5 $\mu$m and forming a current blocking layer on both sides of the ridge portion so that the distance t between the upper surface of the second conductivity type second cladding layer exposed around the ridge portion and the emission layer satisfies the relation of $t \leq 0.275/(1-(X2-X1))$ [$\mu$m] assuming that X2 represents the composition ratio of Al in group III elements and t represents the distance.

According to this method of manufacturing a semiconductor laser device, it is possible to readily manufacture a semiconductor laser device exhibiting small change of a horizontal angle of a laser beam also when the lower width W of the ridge portion is increased for attaining a high output, having the distance between the emission layer and the current blocking layer set in a range not abruptly reducing the horizontal divergence angle of the laser beam and having the lower width W of the ridge potion set in a range not abruptly increasing an operating voltage.

In particular, the first conductivity type cladding layer preferably contains Al and Ga as group III elements and has the composition ratio X1 of Al in the sum of the contents of Al and Ga, while the current blocking layer preferably contains Al and Ga as group III elements and has the composition ratio X2 of Al in the sum of the contents of Al and Ga. In this case, the aforementioned effects are remarkable.

The second conductivity type first and second cladding layers are preferably made of $Al_{X1}Ga_{1-X1}As$, and the current blocking layer is preferably made of $Al_{X2}Ga_{1-X2}As$. Thus, the aforementioned effects are further obvious.

The distance t may satisfy the relation of $t \leq 0.252/(1-(X2-X1))$ [$\mu$m]. In this case, the horizontal divergence angle of the laser beam is less reduced but attains a value exceeding a constant level.

In particular, the distance t is preferably at least 0.15 $\mu$m. In this case, the horizontal divergence angle exhibits a small fluctuation width regardless of fluctuation of the distance t.

Further, the distance t is preferably at least 0.2 $\mu$m. In this case, the horizontal divergence angle exhibits a smaller fluctuation value when the distance t fluctuates.

The upper surface of the substrate is preferably the {100} plane or inclined by several degrees from the {100} plane, and the step of forming the ridge portion preferably includes steps of forming a mask extending in the <011> direction and performing etching with the mask. Alternatively, the upper surface of the substrate is preferably the {100} plane or inclined by several degrees from the {100} plane, and the step of forming the ridge portion preferably includes steps of forming a mask extending in the <011> direction and performing etching with the mask.

According to this method, it is possible to readily form a ridge portion having the angle θ of inclination of at least 70° and not more than 117° on the side surfaces, with respect to the upper surface of the substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 9 to 13 illustrate the relations between a first critical distance t1 and $1/(1-(X2-X1))$;

FIG. 14 illustrates the relations between horizontal divergence angles of laser beams and lower widths W of ridge portions;

FIG. 15 illustrates the relation between an operating voltage and a lower width W of a ridge portion;

FIG. 16 illustrates the relation between a second critical distance t2 and $1/(1-(X2-X1))$.

DESCRIPTION OF THE PREFERRED EMBODIMENTS

An embodiment of the present invention is now described in detail with reference to the drawings.

Figure 1:
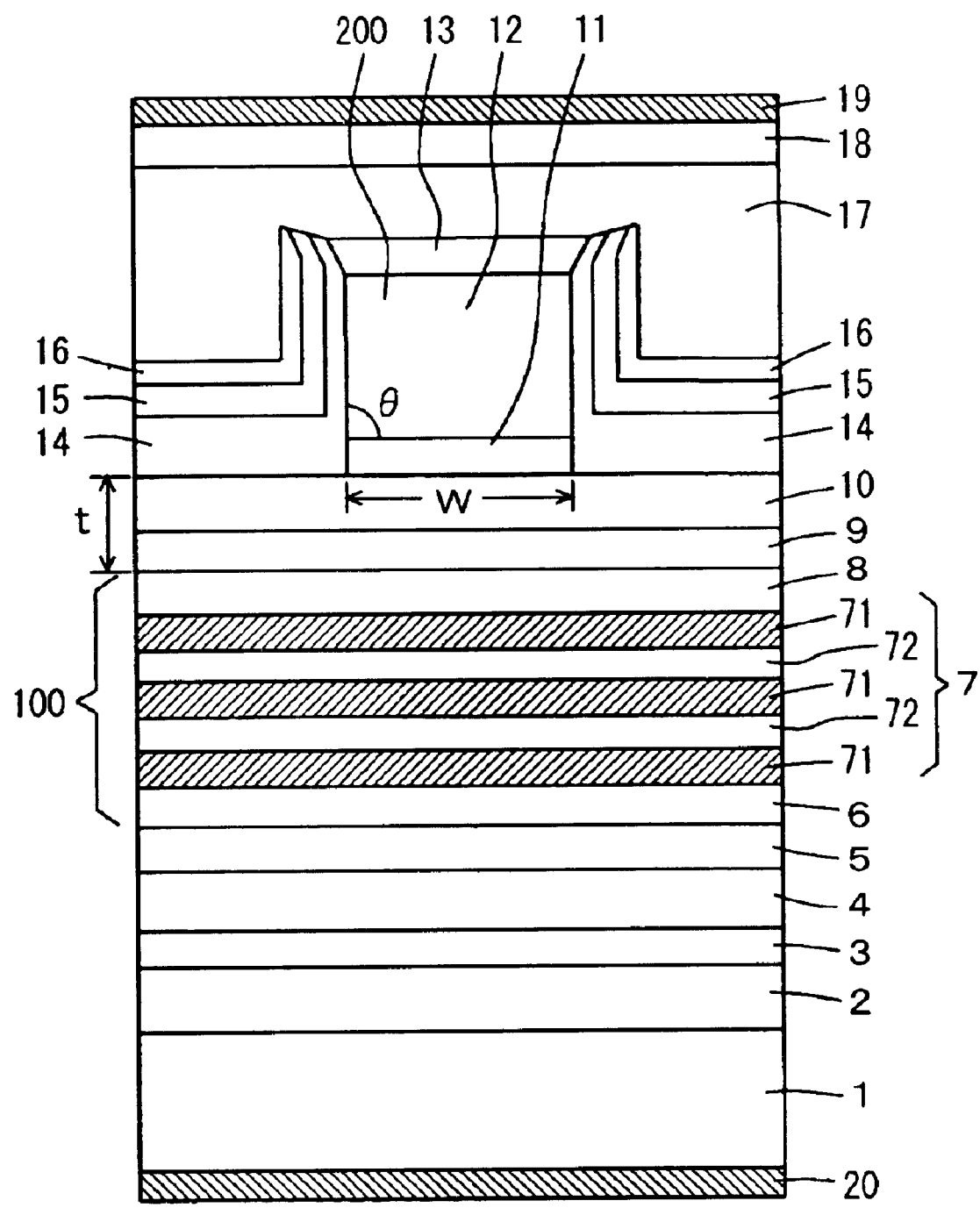
FIG. 1 illustrates the structure of a semiconductor laser device according to the present invention.
Figure 2:
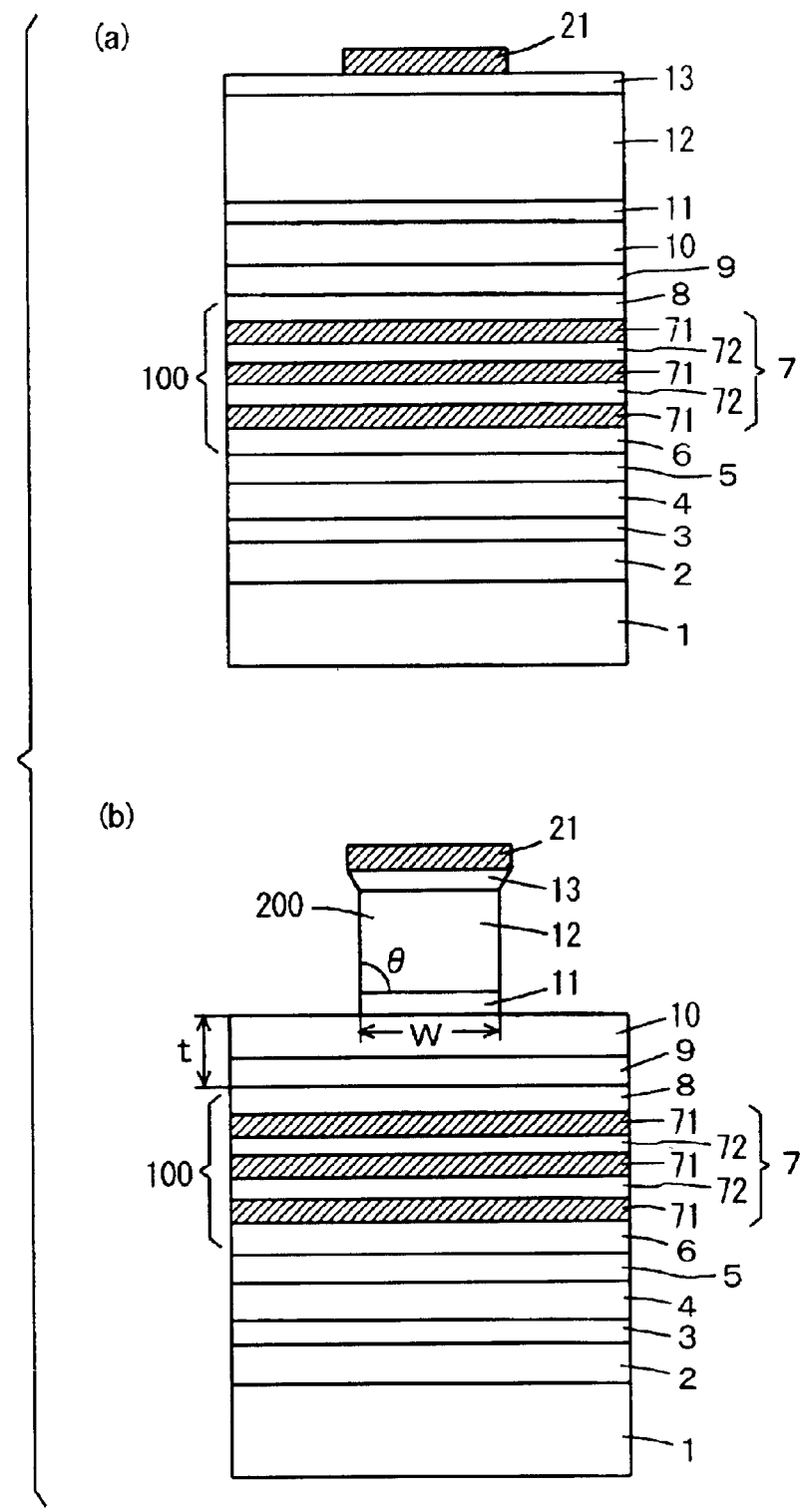
FIGS. 2(a), 2(b), 3(c) and 3(d) illustrate a method of manufacturing the semiconductor laser device according to the present invention.
Figure 3:
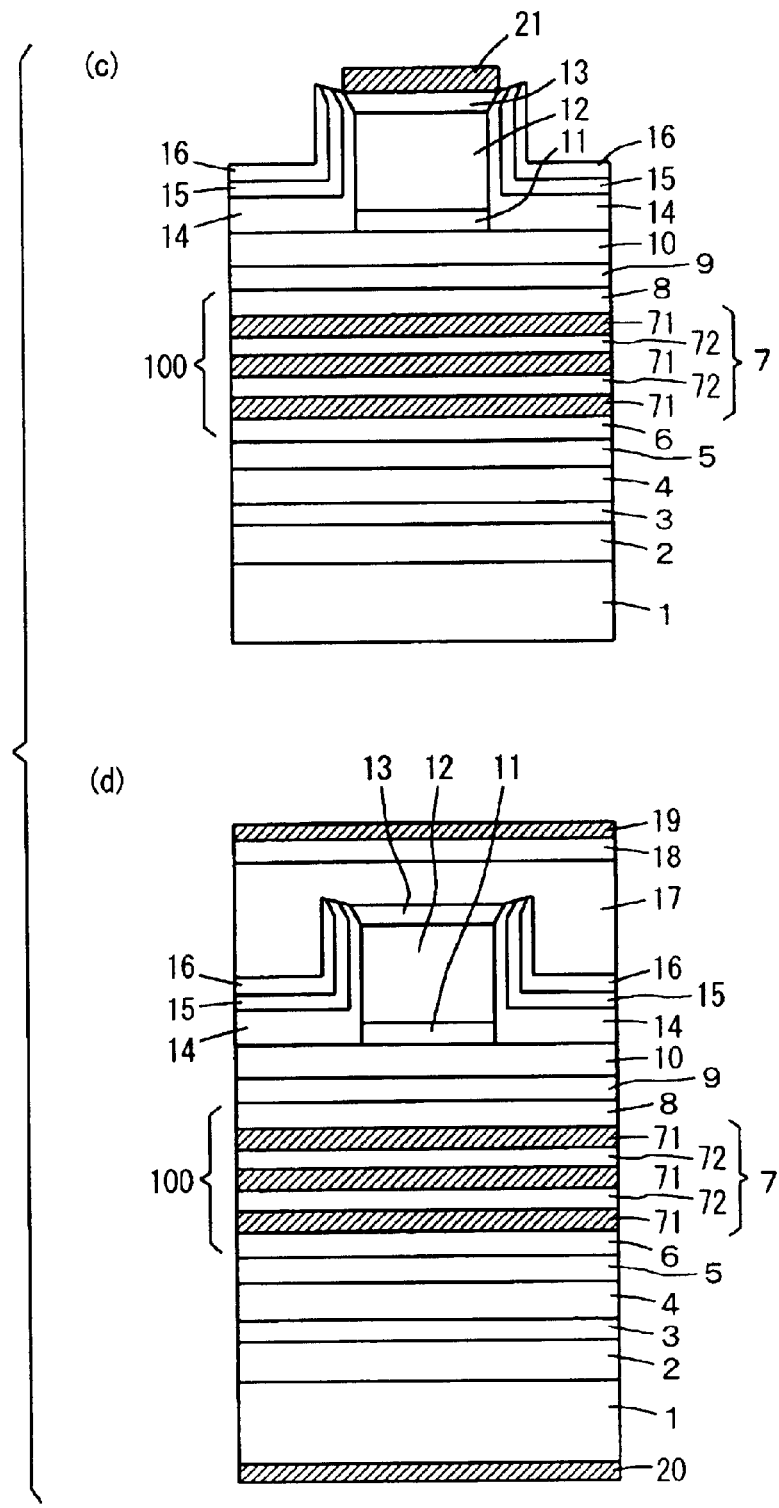

FIG. 1 is a sectional view of a semiconductor laser device according to the embodiment of the present invention.

In the semiconductor device according to this embodiment, an n-type first buffer layer 2 of n-type GaAs, an n-type second buffer layer 3 of n-type AlGaAs, an n-type cladding layer 4 of n-type AlGaAs, an n-type carrier blocking layer 5 of n-type AlGaAs, a light guide layer 6 of undoped AlGaAs and an active layer 7 of an undoped multiple quantum well structure are successively formed on an n-type semiconductor substrate 1 of n-type GaAs. The n-type semiconductor substrate 1 is a slightly inclined substrate having an upper surface inclined from the (100) plane by several degrees (4° in the [011] direction in this embodiment) in the <011> direction on the plane.

The active layer 7 is formed by alternately stacking three quantum well layers 71 of undoped GaAs and two barrier layers 72 of undoped AlGaAs.

A light guide layer 8 of undoped AlGaAs, a p-type carrier blocking layer 9 of p-type AlGaAs and a p-type first cladding layer 10 of p-type AlGaAs are successively formed on the active layer 7.

In the semiconductor laser device according to this embodiment, the light guide layer 6, the active layer 7 and the light guide layer 8 form an emission layer 100.

A striped p-type second cladding layer 12 of p-type AlGaAs extending toward a cavity and a p-type first contact layer 13 of p-type GaAs are successively stacked on a central portion of the p-type first cladding layer 10 through a p-type etching stop layer 11 of p-type AlGaAs to form a ridge portion 200. The striped ridge portion 200 extends in the <011> direction on the upper surface of the n-type semiconductor substrate 1.

A first current blocking layer 14 of undoped AlGaAs, an n-type second current blocking layer 15 of n-type AlGaAs and an n-type third current blocking layer 16 of n-type GaAs are successively formed on both side surfaces of the p-type second cladding layer 12 and the p-type first contact layer 13 forming the ridge portion 200 and flat surface portions of the p-type first cladding layer 10 located on both sides of the ridge portion 200.

A p-type second contact layer 17 of p-type GaAs and a p-type third contact layer 18 of p-type GaAs are successively formed over the p-type first contact layer 13 and the n-type third current blocking layer 16.

A p-type electrode 19 is formed on the p-type third contact layer 18, and an n-type electrode 20 is formed on the rear surface of the n-type semiconductor substrate 1.

FIGS. 2(a) to 3(d) illustrate a method of manufacturing the semiconductor laser device according to this embodiment.

First, the n-type first buffer layer 2, the n-type second buffer layer 3, the n-type cladding layer 4, the n-type carrier blocking layer 5, the light guide layer 6, the active layer 7, the light guide layer 8, the p-type carrier blocking layer 9, the p-type first cladding layer 10, the p-type etching stop layer 11, the p-type second cladding layer 12 and the p-type first contact layer 13 are successively grown on the upper surface of the n-type semiconductor substrate 1 inclined from the (100) plane by several degrees (4° in the [011] direction in this embodiment) in the <011> direction on the plane by MOCVD (metal-organic chemical vapor deposition) or MBE (molecular beam epitaxy) at a growth temperature of 700 to 900° C. Table 1 shows the materials, Al composition ratios, thicknesses and carrier concentrations of the respective layers 2 to 13. The Al composition ratio is expressed by X (the atomic concentration ratio of Al to the sum of the contents of Al and Ga) in $Al_XGa_{1-X}As$. The carrier concentration of the n-type semiconductor substrate 1 is $2 \times 10^{18}$ cm$^{-3}$.

TABLE 1

| | Material | Al Composition Ratio (Atomic Concentration Ratio) | Thickness (nm) | Carrier Concentration (cm$^{-3}$) |
|---|---|---|---|---|
| n-Type Buffer Layer 2 | GaAs | 0 | 500 | $3 \times 10^{17}$ |
| n-Type Buffer Layer 3 | AlGaAs | 0.18 | 100 | $5 \times 10^{17}$ |
| n-Type Cladding Layer 4 | AlGaAs | 0.45 | 2700 | $5 \times 10^{17}$ |
| n-Type Carrier Blocking Layer 5 | AlGaAs | 0.5 | 50 | $5 \times 10^{17}$ |
| Light Guide Layer 6 | AlGaAs | 0.35 | 20 | undoped |
| Quantum Well Layer 71 | AlGaAs | 0.106 | 7 | undoped |
| Barrier Layer 72 | AlGaAs | 0.35 | 8 | undoped |
| Light Guide Layer 8 | AlGaAs | 0.35 | 20 | undoped |
| p-Type Carrier Blocking Layer 9 | AlGaAs | 0.5 | 50 | $1 \times 10^{18}$ |
| p-Type First Cladding Layer 10 | AlGaAs | 0.45 | 0–400 | $1 \times 10^{18}$ |
| p-Type Etching Stop Layer 11 | AlGaAs | 0.7 | 20 | $8 \times 10^{17}$ |
| p-Type Second Cladding Layer 12 | AlGaAs | 0.45 | 2700 | $8 \times 10^{17}$ |
| p-Type First Contact Layer 13 | GaAs | 0 | 200 | $4 \times 10^{18}$ |

In order to grow the n-type first buffer layer 2, AsH$_3$ and TMG are employed as material gas and H$_2$Se is employed as dopant gas. In order to grow the n-type second buffer layer 3, the n-type cladding layer 4 and the n-type carrier blocking layer 5, AsH$_3$, TMG and TMA are employed as material gas and H$_2$Se is employed as dopant gas. In order to grow the light guide layer 6, the active layer 7 and the light guide layer 8, AsH$_3$, TMG and TMA are employed as material gas. In order to grow the p-type carrier blocking layer 9, the p-type first cladding layer 10, the p-type etching stop layer 11 and the p-type second cladding layer 12, AsH$_3$, TMG and TMA are employed as material gas and DEZ is employed as dopant gas. In order to grow the p-type first contact layer 13, AsH$_3$ and TMG are employed as material gas and DEZ is employed as dopant gas.

AsH$_3$ stands for arsine, TMG stands for trimethyl gallium, TMA stands for trimethyl aluminum, H$_2$Se stands for hydrogen selenide, SiH$_4$ stands for monosilane and DEZ stands for diethylzinc.

Well, when growing various AlGaAs layers on GaAs substrates by 2 μm at various ratios of supply quantities of TMG and TMA and measuring an angle of reflection from the (004) plane of the each AlGaAs layer by X-ray analysis for obtaining the Al composition ratio of each AlGaAs layer, it was possible to confirm that the Al composition ratio in the AlGaAs layer matches with the ratio of the supply quantities of TMG and TMA, i.e., the ratio TMA supply quantity/ (TMG supply quantity+TMA supply quantity). Thus, it was possible to confirm that the Al composition ratio in each of the aforementioned layers 2 to 13 matches with the ratio of the supply quantities of the raw materials TMG and TMA, i.e., the ratio of the TMA supply quantity to (TMG supply quantity+TMA supply quantity).

In this case, therefore, the Al composition ratio in each of the layers 2 to 13 was adjusted by adjusting the ratio of the supply quantities of TMG and TMA. The supply quantities of the material gas were controlled with mass flow controllers (MFCS).

After growing the layers 2 to 13 in the aforementioned manner, an oxide film of SiO$_2$ or the like is formed on the p-type first contact layer 13 and thereafter removed by general photolithography while leaving a central striped region, thereby forming a striped oxide film 21 on the p-type first contact layer 13. At this time, the striped oxide film 21 is formed to extend in the <011> direction on the upper surface of the n-type semiconductor substrate 1.

Then, the p-type first contact layer 13, the p-type second cladding layer 12 and the p-type etching stop layer 11 are removed by etching through the oxide film 21 serving as a mask until the p-type first cladding layer 10 is exposed, as shown in FIG. 2(b). Thus, the striped ridge portion 200 is formed under the oxide film 21. The striped ridge portion 200 extends in the <011> direction on the upper surface of the n-type semiconductor substrate 1.

The layers 13, 12 and 11 may be removed by either wet etching or dry etching. The etching stop layer 11 may alternatively be prepared from GaAs, for example, so far as the difference between the Al composition ratios of the etching stop layer 11 and the p-type second cladding layer 12 is in excess of a constant level.

The angle θ (equal to the angle formed by the side surfaces of the ridge portion 200 and the upper surface of the p-type etching stop layer 11 in this embodiment) of inclination of the side surfaces of the ridge portion 200 with respect to the n-type semiconductor substrate 1 can be set to a prescribed value described below in detail by controlling the relation between the plane orientation of the upper surface of the semiconductor substrate 1 and the striped direction of the ridge portion 200, the contents of hydrogen peroxide and water and the temperature in wet etching or energy of ions in reactive ion etching or reactive ion beam etching.

When employing wet etching, the angle θ of inclination on the side surfaces of the ridge portion 200 can be readily set in excess of 70° by selecting the direction of extension of the striped oxide film 21 along the <011> direction. When forming the ridge portion 200 by dry etching, the angle θ of inclination on the side surfaces of the ridge portion 200 can be readily set in excess of 70° regardless of the direction of extension of the oxide film 21. Also in the case of the dry etching, the angle θ of inclination on the side surfaces of the ridge portion 200 can be set in excess of 70° under conditions not damaging the etching surface by selecting the direction of extension of the striped oxide film 21 along the <011> direction.

A lower width W of the ridge portion 200 can be set to a prescribed value described below in detail by controlling the thickness of the p-type second cladding layer 12, the width of the oxide film 21, the angle θ of inclination on the side surfaces of the ridge portion 200, the etching time or the like.

The sum of the thicknesses of the p-type carrier blocking layer 9 and the p-type first cladding layer 10 is set to a prescribed value described below in detail by controlling the growth times for forming the p-type carrier blocking layer 9 and the p-type first blocking layer 10 in the step shown in FIG. 2(a) and controlling the etching depth by the etching stop layer 11 in the step shown in FIG. 2(b). The sum of the thicknesses of the p-type carrier blocking layer 9 and the p-type first cladding layer 10 defines the distance t between the emission layer 100 and the first current blocking layer 14 formed in a subsequent step.

Then, the undoped first current blocking layer 14, the n-type second current blocking layer 15 and the n-type third current blocking layer 16 are selectively grown on the flat surface portions of the p-type second cladding layer 10 located on both sides of the ridge portion 200 and the side surfaces of the ridge portion 200 through the oxide film 21 serving as a mask at a growth temperature of 600 to 900°. At this time, these layers 14 to 16 are not grown on the oxide film 21. Table 2 shows the materials, Al composition ratios, thicknesses and carrier concentrations of the layers 14 to 16. The Al composition ratio of the first current blocking layer 14 is set in a range satisfying conditions described below in detail.

TABLE 2

| | Material | Al Composition Ratio (Atomic Concentration Ratio) | Thickness (μm) | Carrier Concentration (cm$^{-3}$) |
|---|---|---|---|---|
| First Current Blocking Layer 14 | AlGaAs | X$_2$ (0.5–0.8) | 1.0 | undoped |
| n-Type Second Current Blocking Layer 15 | AlGaAs | X$_2$ (0.5–0.8) | 0.25 | 3 × 10$^{18}$ |
| n-Type Third Current Blocking Layer 16 | GaAs | 0 | 0.25 | 5 × 10$^{17}$ |

In order to grow the first current blocking layer 14, AsH$_3$, TMG and TMA are employed as material gas. In order to grow the n-type second current blocking layer 15, AsH$_3$, TMG and TMA are employed as material gas and H$_2$Se is employed as dopant gas. In order to grow the n-type third current blocking layer 16, AsH$_3$ and TMG are employed as material gas and H$_2$Se is employed as dopant gas. Also in this case, the Al composition ratios are adjusted by adjusting the ratios of the supply quantities of TMG and TMA, similarly to the case of the aforementioned layers 2 to 13.

Then, the oxide film 21 is removed by wet etching or dry etching, and thereafter the p-type second contact layer 17 and the p-type third contact layer 18 are grown on the p-type first contact layer 13 and the n-type third current blocking layer 16 at a growth temperature of 600 to 900° C. Table 3 shows the materials, Al composition ratios, thicknesses and carrier concentrations of the layers 17 and 18.

TABLE 3

| | Material | Al Composition Ratio (Atomic Concentration Ratio) | Thickness ($\mu$m) | Carrier Concentration ($cm^{-3}$) |
|---|---|---|---|---|
| p-Type Second Contact Layer 17 | GaAs | 0 | 5.3 | $1 \times 10^{19}$ |
| p-Type Third Contact Layer 18 | GaAs | 0 | 0.7 | $6 \times 10^{19}$ |

In order to grow the p-type second contact layer 17 and the p-type third contact layer 18, $AsH_3$ and TMG are employed as material gas and DEZ is employed as dopant gas. The thickness of the p-type first contact layer 13, which can be remarkably reduced without causing any problem on the characteristics of the device, may be in the range of at least 5 nm and not more than 1000 nm.

Finally, the p-type electrode 19 of CrAu in a thickness of about 50 nm and Au in a thickness of about 1.5 $\mu$m is formed on the p-type third contact layer 18 while the n-type electrode 20 of AuGe/Ni/Au is formed on the rear surface of the n-type semiconductor substrate 1. The semiconductor laser device having the structure shown in FIG. 1 is manufactured through the aforementioned steps.

Figure 4:
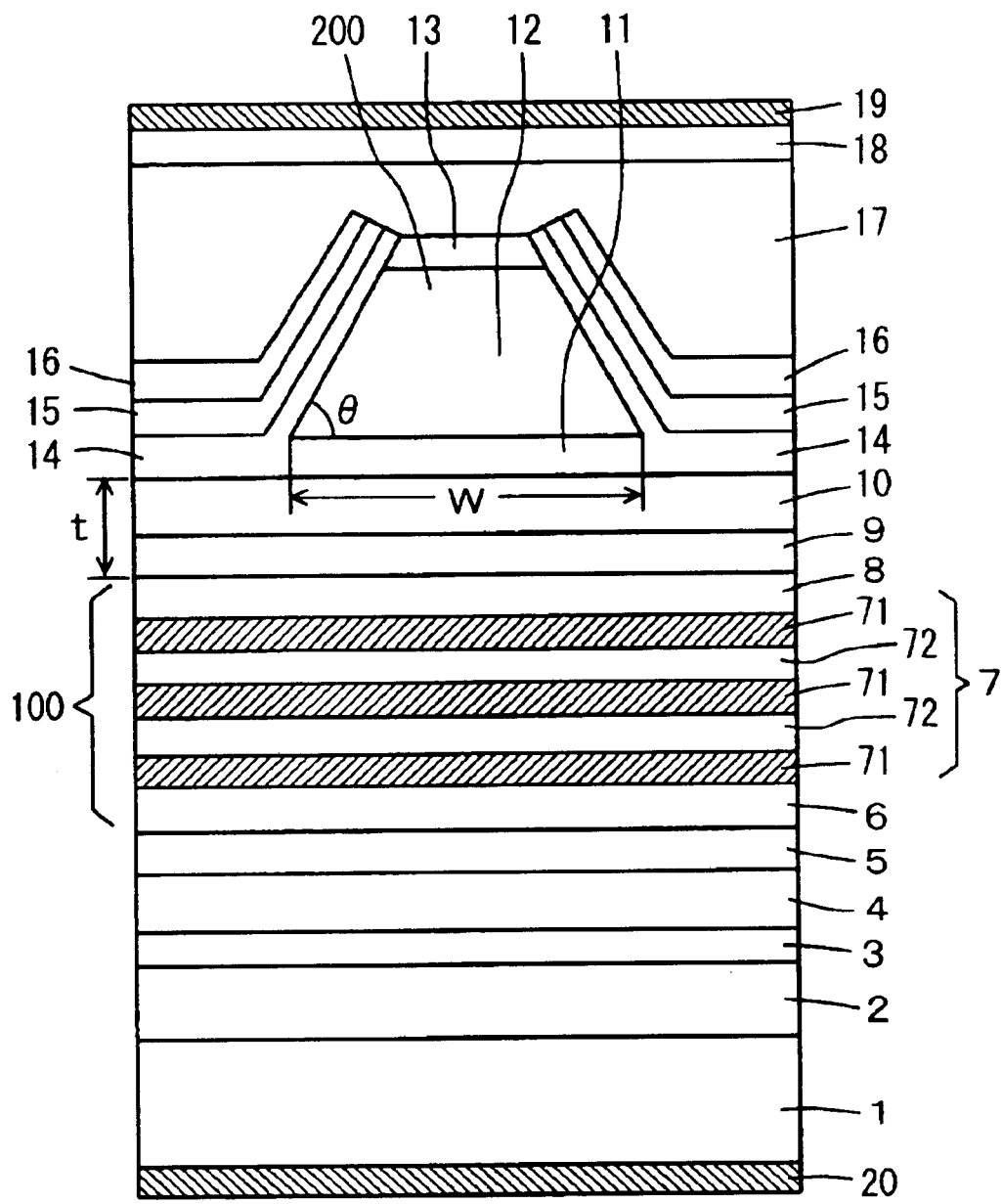
FIG. 4 illustrates the structure of a semiconductor laser device having a ridge portion of a forward mesa structure according to the present invention.

With reference to the semiconductor laser device having the structure shown in FIG. 1, a plurality of types of samples were prepared by setting the angle θ (corresponding to the angle θ formed by the side surfaces of the ridge portion 200 and the upper surface of the etching stop layer 11 in this embodiment) at 55°, 70°, 80°, 90°, 100°, 110°, 117° and 125° respectively. Each sample of the semiconductor laser device had the ridge portion 200 of the forward mesa structure shown in FIG. 4 when the angle θ of inclination was set to 55°, 70° and 80°, while each sample of the semiconductor laser device had the ridge portion 200 of the reverse mesa structure shown in FIG. 5 when the angle θ of inclination was set to 100°, 110°, 117° and 125°. When the angle θ of inclination was set to 90°, the sample of the semiconductor laser device had the ridge portion 200 having upright side surfaces as shown in FIG. 1.

The angle θ of inclination was measured by observing the front facet of each sample with a scanning electron microscope (SEM) after preparation of the sample and acquiring a sectional SEM image (photograph) of the front facet. At this time, the magnification was set to about 6000. The angle formed by the side walls of the ridge portion 200 and the flat portion was measured with a protractor on the obtained SEM image (photograph), to obtain the angle θ of inclination.

In the samples of the semiconductor laser device having the aforementioned different angles θ of inclination, the lower widths W of the ridge portions 200 were varied for measuring the horizontal divergence angles of the laser beams. FIGS. 6(a) to 7(f) show the results. In each sample of the semiconductor laser device, the thickness of the p-type second cladding layer 12 was 2000 nm.

As understood from FIGS. 6(a) and 6(b), the horizontal divergence angles of the laser beams were remarkably reduced when increasing the lower widths W of the ridge portions 200 in the samples having the angles θ of inclination set to 55° and 125° respectively.

As understood from FIGS. 7(a) to 7(f), the horizontal divergence angles of the laser beams were hardly reduced also when the lower widths W of the ridge potions 200 were increased up to 5 $\mu$m in the samples having the angles θ of inclination set to 70°, 80°, 90°, 100°, 110° and 117° respectively.

Figure 5:
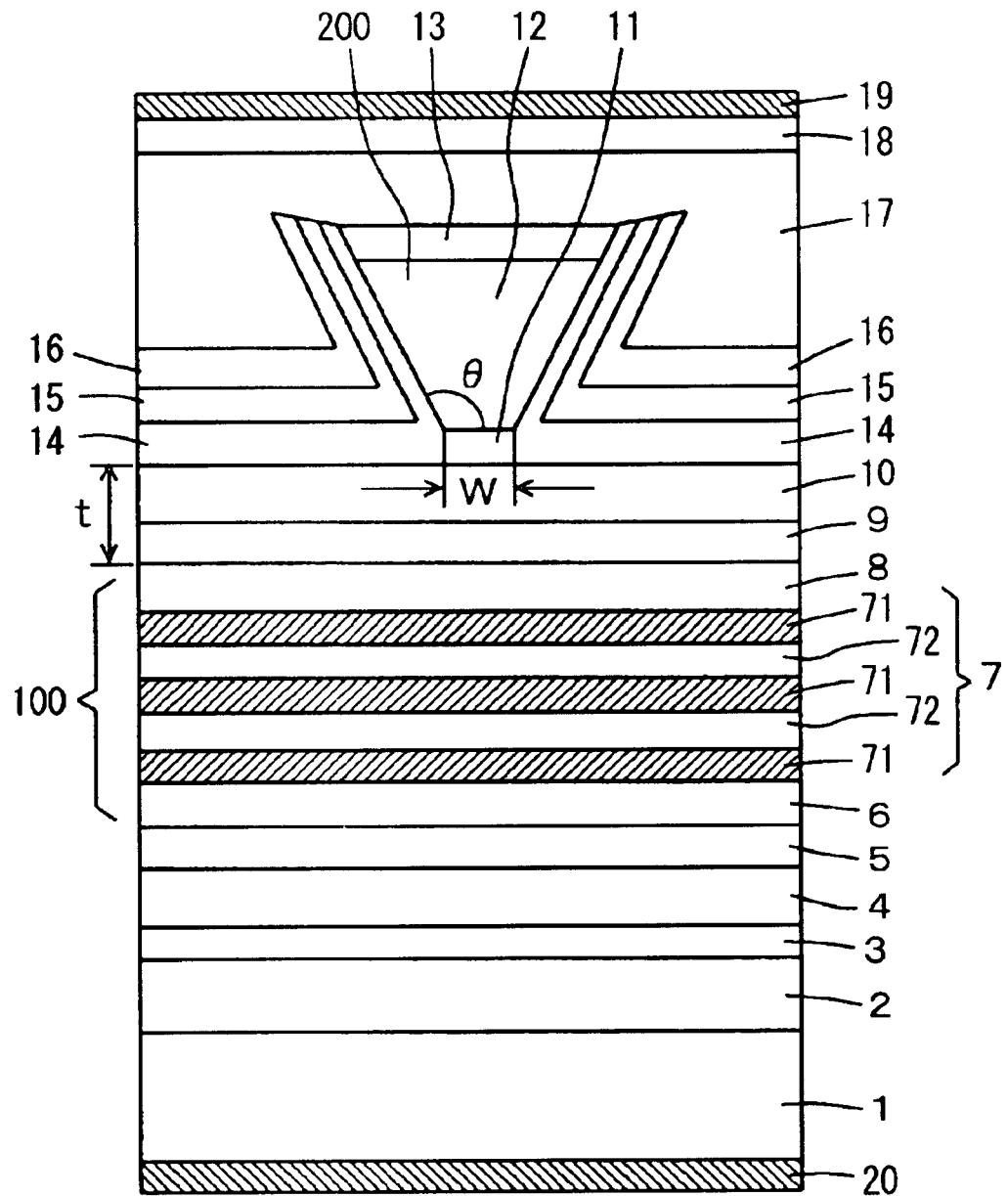
FIG. 5 illustrates the structure of a semiconductor laser device having a ridge portion of a reverse mesa structure according to the present invention.
Figure 6:
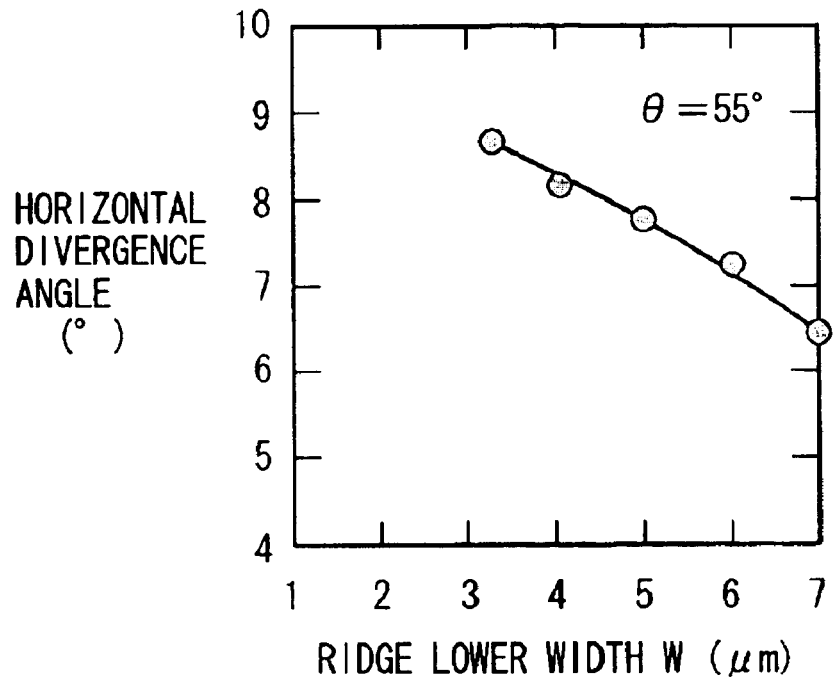
FIGS. 6(a), 6(b) and 7(a) to 7(f) illustrate the relations between horizontal divergence angles of laser beams and lower widths W of ridge portions.
Figure 6:
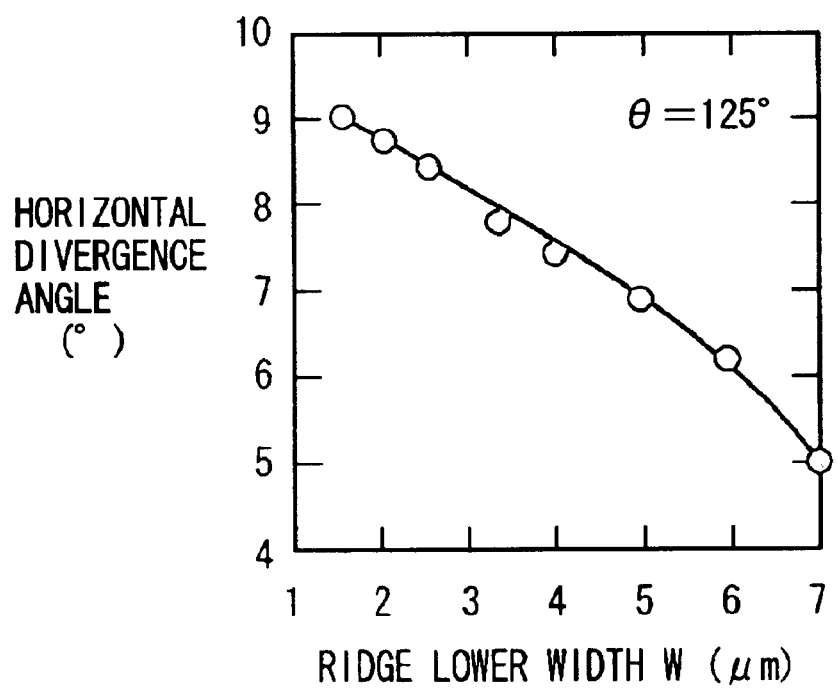
Figure 7:
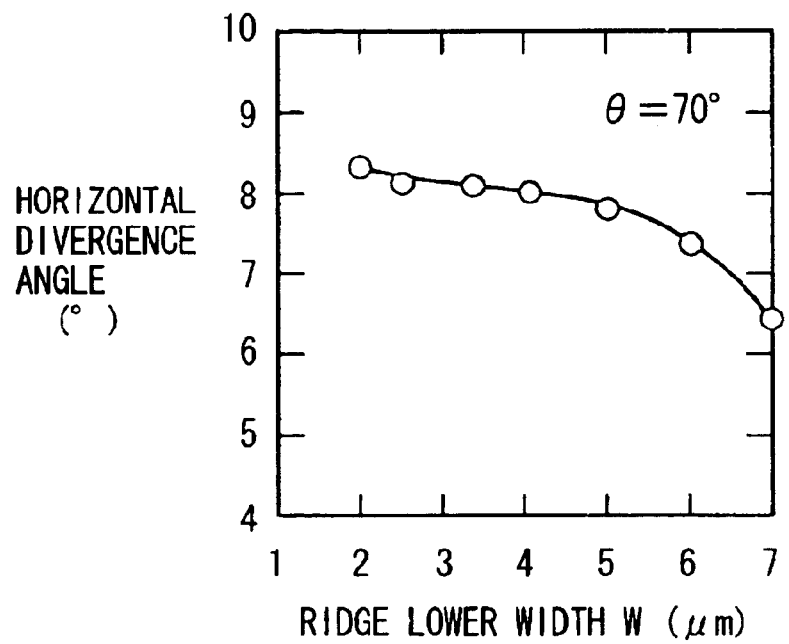
Figure 7:
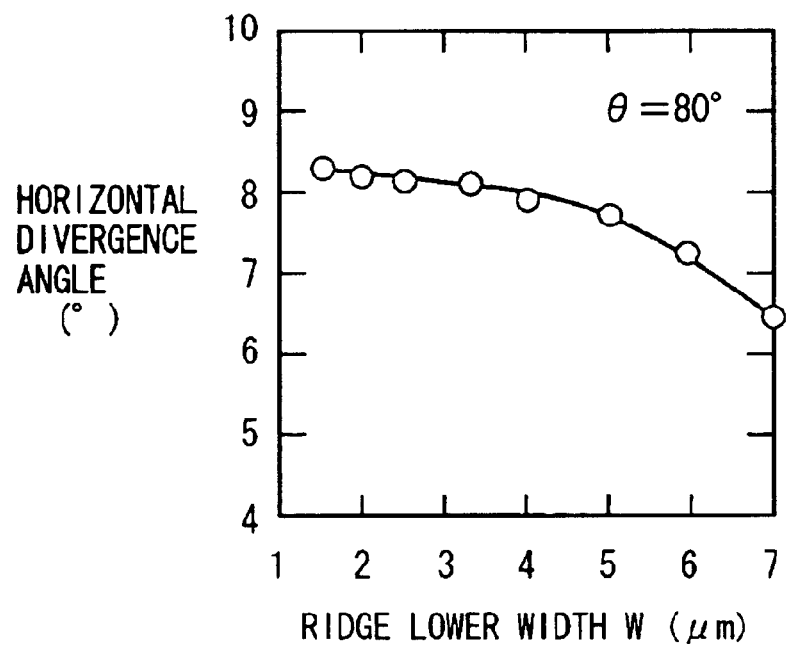
Figure 7:
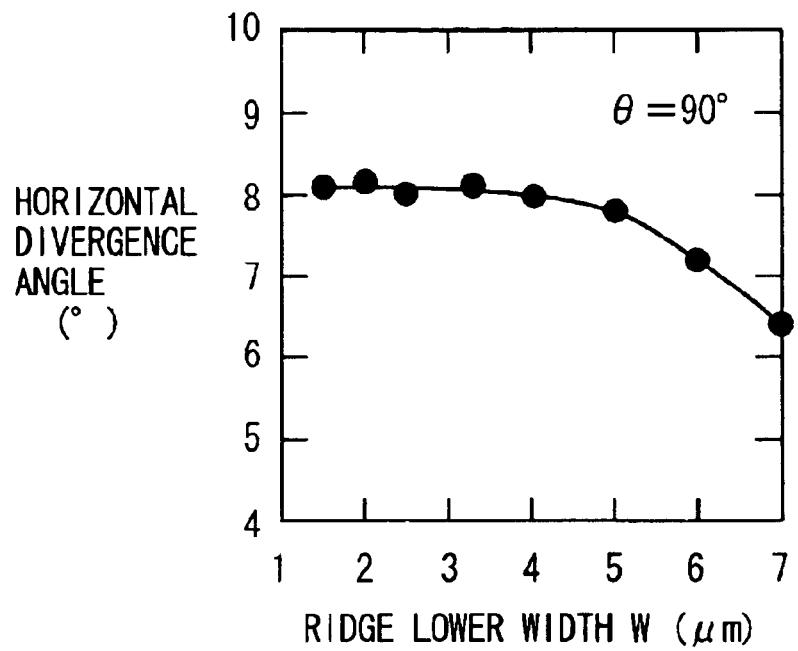
Figure 7:
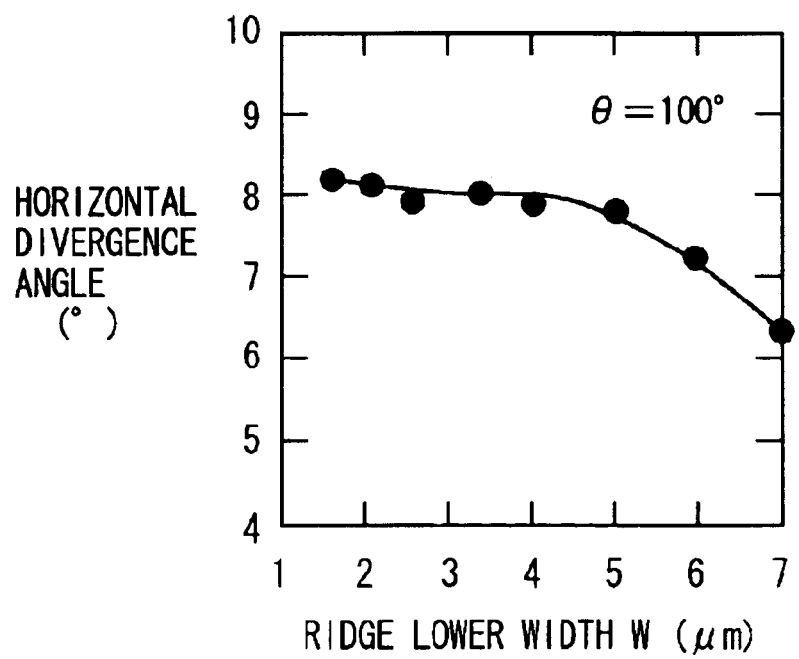
Figure 7:
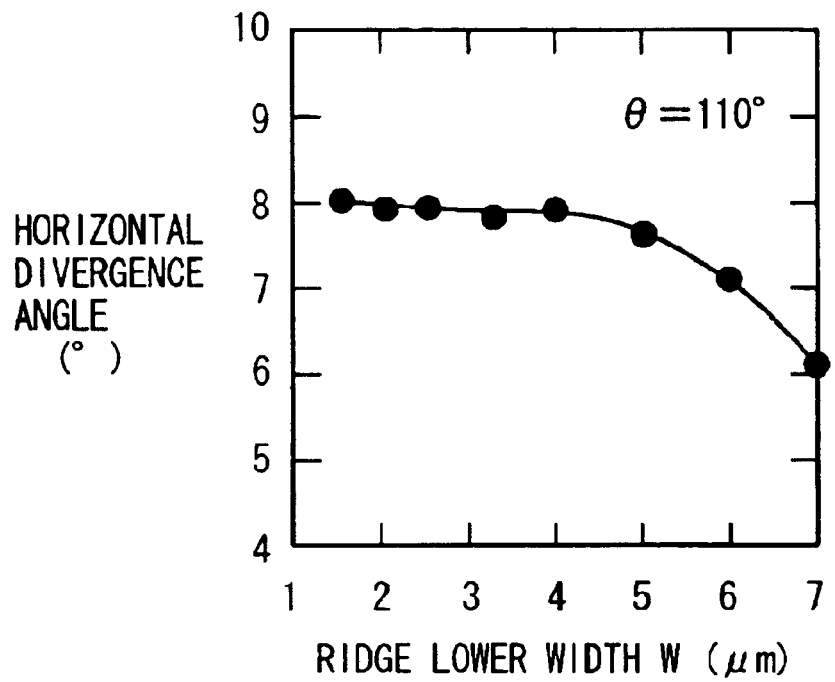
Figure 7:
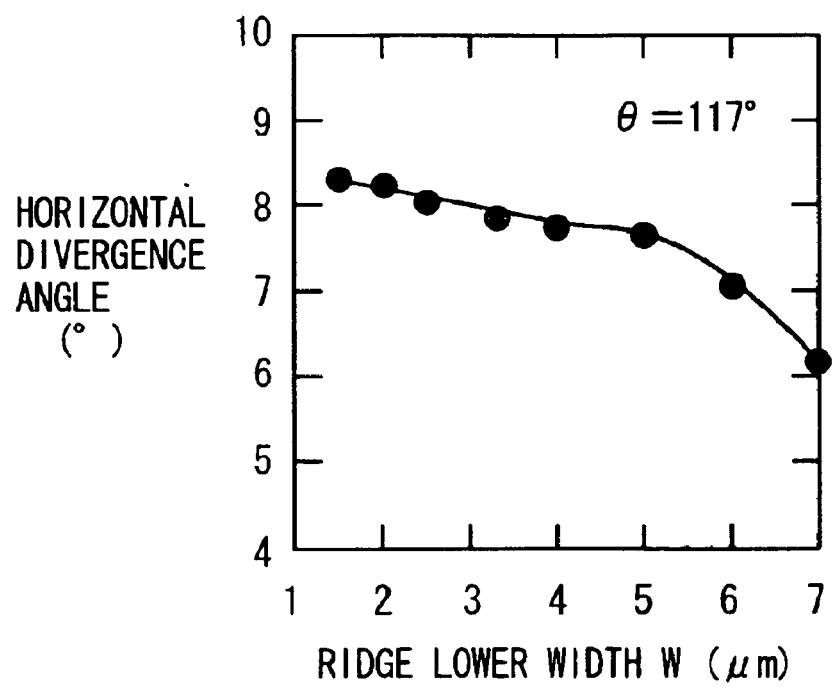
Figure 8:
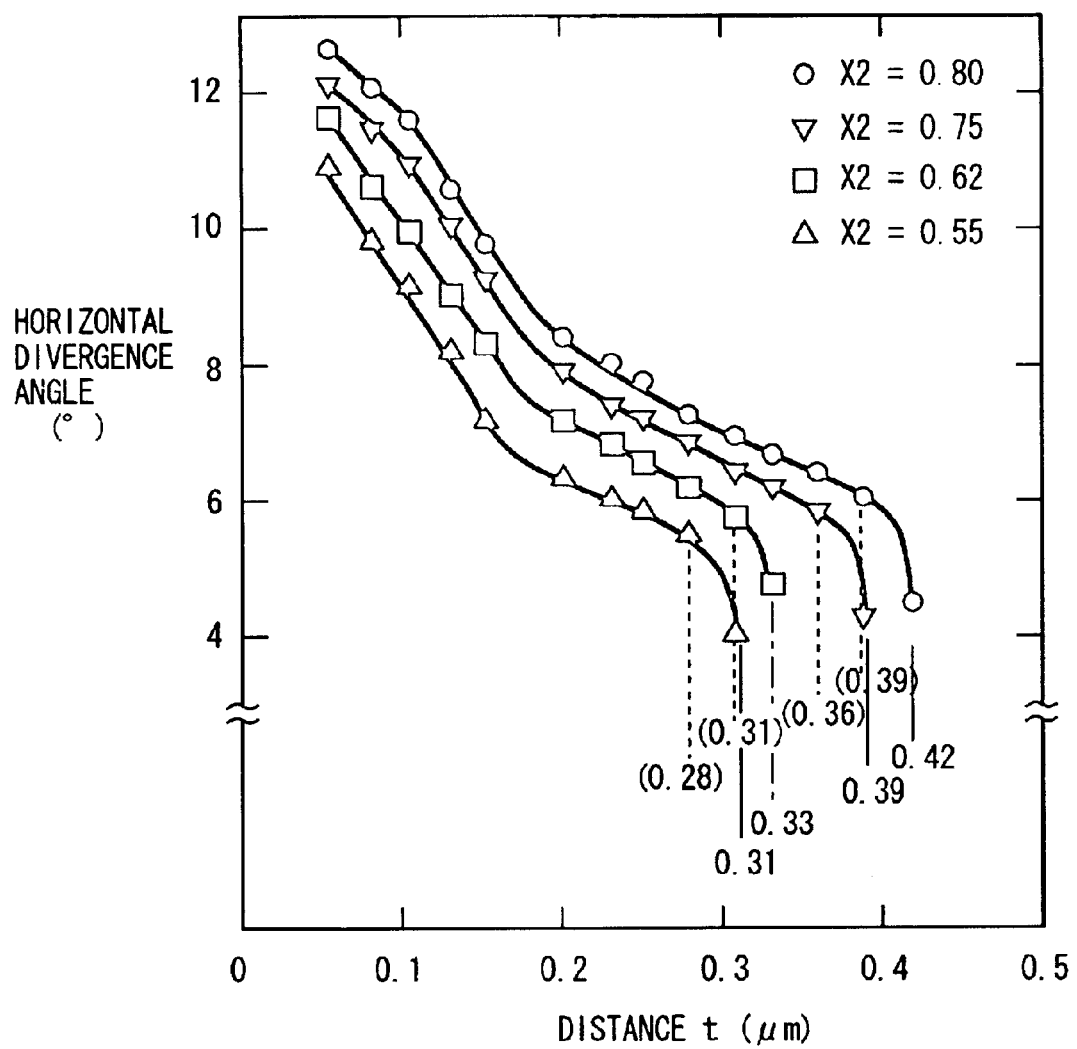
FIG. 8 illustrates the relations between horizontal divergence angles of laser beams and distances t between emission layers and current blocking layers.
Figure 17:
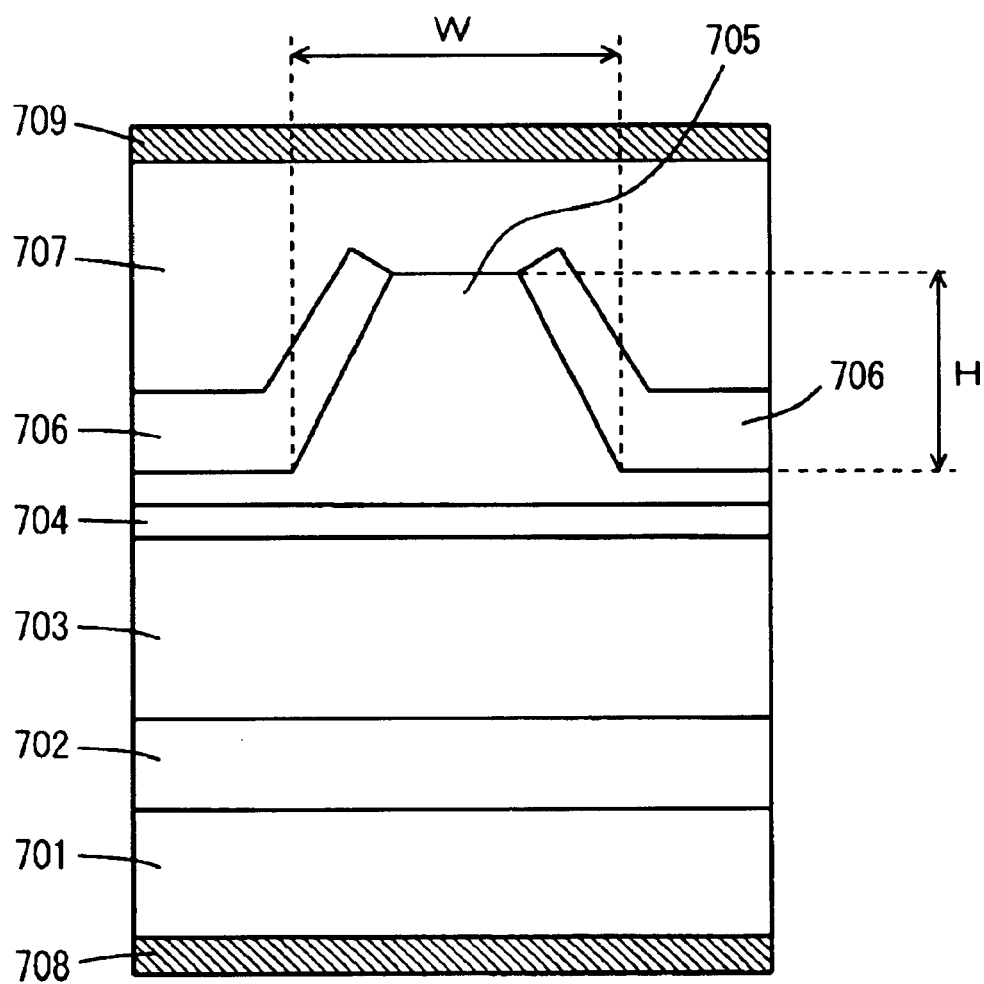
FIG. 17 illustrates the structure of a conventional semiconductor laser device.

As to the semiconductor laser device having the ridge portion 200 of the reverse mesa structure with the angle θ of inclination of 100° and the lower width W of 4 $\mu$m shown in FIG. 5, four types of samples were prepared by setting the Al composition ratio X2 of the first current blocking layer 14 and the n-type second current blocking layer 15 to 0.55, 0.62, 0.75 and 0.80 respectively, for investigating the relation between the distance t between the emission layer 100 and the first current blocking layer 14 (the sum of the thicknesses of the n-type carrier blocking layer 9 and the p-type first cladding layer 10) and the horizontal divergence angle of the laser beam in each sample. FIG. 8 shows the results.

As understood from FIG. 8, the horizontal divergence angle of the laser beam is reduced when the distance t is increased, while inclination of such reduction of the horizontal divergence angle is reduced when the distance t exceeds 0.15 $\mu$m and the inclination of the reduction of the horizontal divergence angle is further reduced when the distance t exceeds 0.2 $\mu$m. It is also understood that there is a first critical distance t1 when the distance t excess a certain value abruptly reducing the horizontal divergence angle. This first critical distance t1 is 0.31 when the Al composition ratio X2 is 0.55, 0.33 when the Al composition ratio X2 is 0.62, 0.39 when the Al composition ratio X2 is 0.75, and 0.42 when the Al composition ratio X2 is 0.80.

It is also understood from FIG. 8 that there is a second critical distance t2, smaller than the first critical distance t1, defining the upper limit of a stable distance causing small reduction of the horizontal divergence angle also when the distance t increases. The second critical distance t2 is 0.28 when the Al composition ratio X2 is 0.55, 0.31 when the Al composition ratio X2 is 0.62, 0.36 when the Al composition ratio X2 is 0.75, and 0.39 when the Al composition ratio X2 is 0.80.

In order to investigate the relation between the Al composition ratio X2 of the first current blocking layer 14 and the n-type second current blocking layer 15 and the first critical distance t1, the relation between the inverse number of a value obtained by subtracting the difference between the Al composition ratio X2 of the first current blocking layer 14 and the n-type second current blocking layer 15 and the Al composition ratio X1 (0.45 in this embodiment) of the p-type cladding layers 10 and 12 from 1, i.e. 1/(1−(X2−X1)), and the first critical distance t1 was graphed out. FIG. 9 shows the result.

As understood from FIG. 9, the first critical distance t1 is proportionate to the inverse number (1/(1−(X2−X1))) of the value obtained by subtracting the difference between the Al composition ratios X2 and X1 from 1, as expressed in a proportional expression t1=0.275/(1−(X2−X1)). In other words, the horizontal divergence angle is abruptly reduced when the distance t exceeds 0.275/(1−(X2−X1)), and hence the distance t must satisfy the relation of t≦0.275/(1−(X2−X1)) in order not to abruptly reduce the horizontal divergence angle.

Also when investigating samples prepared by setting the angle θ of inclination to 70°, 80°, 110° and 117° respectively, results similar to that shown in FIG. 8 were obtained. When graphing out the relation between 1/(1−(X2−X1)) and the first critical distance t1, results shown in FIGS. 10 to 13 were obtained.

As understood from FIGS. 10 to 13, the distance t must satisfy the relation of t≦0.275/(1−(X2−X1)) in order not to abruptly reduce the horizontal divergence angle also when setting the angle θ of inclination to 70°, 80°, 110° and 117°.

As to the sample of the semiconductor laser device having the angle θ of inclination of 100° on the ridge portion 200, further samples were prepared by setting the Al composition ratio X2 of the current blocking layers 14 and 15 and the distance t to 0.80 and 0.10 μm, 0.75 and 0.20 μm and 0.58 and 0.25 μm respectively for investigating the horizontal divergence angles of the laser beams at various lower widths W of the ridge portions 200. FIG. 14 shows the results.

As understood from FIG. 14, the horizontal divergence angle of the laser beam is substantially constant when the lower width W of the ridge portion 200 is at least 1.5 μm and not more than 5 μm, while the horizontal divergence angle of the laser beam is abruptly reduced when the lower width W exceeds 5 μm.

As to the sample of the semiconductor laser device having the angle θ of inclination of 100° on the ridge portion 200, the Al composition ratio X2 of the current blocking layers 14 and 15 of 0.75 and the distance t2 of 0.20 μm, the ridge lower width W and the operating voltage with an operating current of 40 mA were investigated. FIG. 15 shows the results.

As understood from FIG. 15, the operating voltage is abruptly increased when the lower width W of the ridge portion 200 falls below 2 μm. Therefore, the lower width W must be at least 2 μm.

In other words, the lower width W of the ridge portion 200 is preferably at least 2 μm and not more than 5 μm in consideration of the horizontal divergence angle and the operating voltage, as understood from FIGS. 14 and 15.

Also as to the second critical distance t2, the relation between 1/(1−(X2−X1)) and the second critical distance t2 was graphed out similarly to the first critical distance t1. FIG. 16 shows the results.

As understood from FIG. 16, the second critical distance t2 is proportionate to the inverse number (1/(1−(X2−X1))) of the value obtained by subtracting the difference between the Al composition ratios X2 and X1 from 1, as expressed in a proportional expression t2=0.252/(1−(X2−X1)). In other words, the distance t must satisfy the relation of t≦0.252/(1−(X2−X1)) in order to attain a horizontal divergence angle (at least 5° in this embodiment) exceeding a constant value with small reduction. Similar results were obtained also when setting the angle θ of inclination on the side surfaces of the ridge portion 200 to 70°, 80°, 110° and 117°.

While the p-type first cladding layer 10 and the p-type second cladding layer 12 have the same Al composition ratio in the aforementioned embodiment, the first and second cladding layers 10 and 12 may alternatively have different Al composition ratios. In this case, the second cladding layer 12 forming the ridge portion 200 has the Al composition ratio X1.

While the n-type semiconductor substrate 1 is formed by the slightly inclined substrate having the upper surface inclined by 4° from the (100) plane in the <011> direction on the plane, results similar to those of the aforementioned embodiment were obtained when the angle of inclination was at least 0° and not more than 13°.

As to the plane orientation of the n-type semiconductor substrate 1, the upper surface may be the {100} plane including the (100) plane or may be inclined by several degrees from the {100} plane, and the striped ridge portion 200 may extend in the <011> direction in this case. In order to form such a ridge portion 200, a striped mask extending in the <011> direction may be prepared. As to the plane orientation of the n-type semiconductor substrate 1, the upper surface may be the {100} plane or may be inclined by several degrees from the {100} plane, and the striped ridge portion 200 may extend in the <011> direction in this case. In order to form such a ridge portion 200, a striped mask extending in the <011> direction may be prepared.

While the semiconductor laser device contains Al and Ga as the group III elements in the aforementioned embodiment, the present invention is also applicable to a semiconductor laser device containing another group III element such as In. The present invention is further applicable to a semiconductor laser device containing P, N and the like as group V elements other than As.

According to the present invention, as hereinabove described, it is possible to provide a semiconductor laser device capable of suppressing reduction of a horizontal divergence angle of a laser beam and readily adjusting the horizontal divergence angle of the laser beam also when increasing the output of the laser beam.

According to the present invention, further, it is possible to provide a method of manufacturing a semiconductor laser device which can readily manufacture a semiconductor laser device capable of suppressing reduction of a horizontal divergence angle of a laser beam and readily adjusting the horizontal divergence angle of the laser beam also when increasing the output of the laser beam.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device comprising:
   a substrate;
   a first conductivity type cladding layer;
   an emission layer;
   a second conductivity type carrier blocking layer;
   a second conductivity type cladding layer containing Al as a group III element and formed with a ridge portion;
   a current blocking layer, formed on said second conductivity type cladding layer around said ridge portion, containing Al as a group III element, wherein
   an angle θ of inclination on a side surface of said ridge portion with respect to an upper surface of said substrate is at least 70° and not more than 117°,
   a distance t between said emission layer and said current blocking layer satisfies a relation of t≦0.275/(1−(X2−X1)) micrometer assuming that X1 represents a composition ratio of Al in group III elements forming said second conductivity type cladding layer, X2 represents a composition ratio of Al in group III elements forming said current blocking layer, wherein said distance t includes the thickness of said second conductivity type cladding layer and the thickness of said carrier blocking layer, and a lower width W of said ridge portion is at least 2 μm and not more than 5 μm.

2. A semiconductor laser device according to claim 1, wherein said first conductivity type cladding layer contains Al and Ga as group III elements, and X1 represents a composition ratio of Al in a composition of Al and Ga, and said current blocking layer contains Al and Ga, as group III elements, and X2 represents the composition ratio of Al in the composition of Al and Ga.

3. The semiconductor laser device according to claim 2, wherein said second conductivity type cladding layer is made of $Al_{X1}Ga_{1-X1}As$, and said current blocking layer is made of $Al_{X2}Ga_{1-X2}As$.

4. The semiconductor laser device according to claim 1, wherein said distance t between said emission layer and said current blocking layer satisfies a relation of $t \leq 0.252/(1-(X2-X1))$ micrometer.

5. The semiconductor laser device according to claim 1, wherein said distance t between said emission layer and said current blocking layer is at least 0.15 μm.

6. The semiconductor laser device according to claim 1, wherein said distance t between said emission layer and said current blocking layer is at least 0.2 μm.

7. The semiconductor laser device according to claim 1, wherein an upper surface of said substrate is a {100} plane or inclined by several degrees, and said ridge portion extends in a <011> direction.

* * * * *